US008370547B2

(12) United States Patent
Karamcheti et al.

(10) Patent No.: US 8,370,547 B2
(45) Date of Patent: Feb. 5, 2013

(54) SYSTEM AND APPARATUS WITH A MEMORY CONTROLLER CONFIGURED TO CONTROL ACCESS TO RANDOMLY ACCESSIBLE NON-VOLATILE MEMORY

(75) Inventors: Vijay Karamcheti, Los Altos, CA (US); Kumar Ganapathy, Los Altos, CA (US); Kenneth Alan Okin, Saratoga, CA (US); Rajesh Parekh, Los Altos, CA (US)

(73) Assignee: Virident Systems, Inc., Milpitas, CA (US)

( * ) Notice: Subject to any disclaimer, the term of this patent is extended or adjusted under 35 U.S.C. 154(b) by 0 days.

(21) Appl. No.: 12/831,233

(22) Filed: Jul. 6, 2010

(65) Prior Publication Data

US 2010/0274957 A1    Oct. 28, 2010

Related U.S. Application Data

(62) Division of application No. 11/847,986, filed on Aug. 30, 2007, now Pat. No. 7,761,623.

(60) Provisional application No. 60/827,421, filed on Sep. 28, 2006, provisional application No. 60/862,597, filed on Oct. 23, 2006.

(51) Int. Cl.
    *G06F 13/12* (2006.01)
(52) U.S. Cl. ............................................ 710/62; 710/74
(58) Field of Classification Search .................. 710/62, 710/74
    See application file for complete search history.

(56) References Cited

U.S. PATENT DOCUMENTS

| | | | |
|---|---|---|---|
| 4,757,533 A | 7/1988 | Allen et al. | |
| 5,012,408 A | 4/1991 | Conroy | |
| 5,379,401 A | 1/1995 | Robinson et al. | |
| 5,404,485 A | 4/1995 | Ban | |
| 5,701,438 A | 12/1997 | Bains | |
| 5,710,733 A | 1/1998 | Chengson et al. | |
| 6,088,750 A | 7/2000 | Beaman et al. | |
| 6,185,704 B1 | 2/2001 | Pawate et al. | |
| 6,393,545 B1 | 5/2002 | Long et al. | |
| 6,549,959 B1 | 4/2003 | Yates et al. | |
| 6,564,326 B2 | 5/2003 | Helbig, Sr. | |
| 6,765,812 B2 * | 7/2004 | Anderson | 365/51 |
| 6,785,780 B1 | 8/2004 | Klein et al. | |
| 6,970,968 B1 | 11/2005 | Holman | |
| 6,990,044 B2 * | 1/2006 | Kang | 365/235 |
| 7,034,955 B2 | 4/2006 | Bearss et al. | |
| 7,091,598 B2 | 8/2006 | Fujita et al. | |
| 7,196,554 B2 | 3/2007 | Taskin et al. | |
| 7,324,352 B2 | 1/2008 | Goodwin | |
| 2002/0017720 A1 | 2/2002 | Nishizawa et al. | |
| 2002/0051350 A1 | 5/2002 | Take | |
| 2002/0118593 A1 | 8/2002 | Takemae | |
| 2002/0133684 A1 | 9/2002 | Anderson | |

(Continued)

OTHER PUBLICATIONS

Arie Tal, NAND Vs. NOR Flash Technology, Feb. 1, 2002, Whole Document, http://www2.electronicproducts.com/NAND vs NORfiash_technology-article-FEBMSYI-feb2002-html.aspx.*

(Continued)

*Primary Examiner* — Chun-Kuan Lee
*Assistant Examiner* — David Martinez
(74) *Attorney, Agent, or Firm* — Alford Law Group, Inc.; William E. Alford

(57) ABSTRACT

An apparatus includes a printed circuit board with a plurality of printed circuit board traces, a memory controller mounted on the printed circuit board coupled to one or more of the plurality of printed circuit board traces, a plurality of non-volatile type of memory integrated circuits coupled to the printed circuit board, and a plurality of support integrated circuits coupled between the memory controller and the plurality of non-volatile type of memory integrated circuits.

7 Claims, 10 Drawing Sheets

U.S. PATENT DOCUMENTS

| | | |
|---|---|---|
| 2002/0138600 A1 | 9/2002 | Singhal |
| 2003/0090879 A1 | 5/2003 | Doblar et al. |
| 2003/0137862 A1 | 7/2003 | Brunnelle et al. |
| 2003/0174569 A1 | 9/2003 | Amidi |
| 2003/0188083 A1 | 10/2003 | Kumar et al. |
| 2004/0026791 A1 | 2/2004 | King et al. |
| 2004/0117581 A1 | 6/2004 | Lee |
| 2004/0160835 A1 | 8/2004 | Altman et al. |
| 2004/0186948 A1 | 9/2004 | Lofgren et al. |
| 2004/0193783 A1 | 9/2004 | Sharma et al. |
| 2004/0236877 A1 | 11/2004 | Burton |
| 2005/0044303 A1 | 2/2005 | Perego et al. |
| 2005/0166026 A1 | 7/2005 | Ware et al. |
| 2005/0235131 A1 | 10/2005 | Ware |
| 2005/0240745 A1 | 10/2005 | Iyer et al. |
| 2005/0251617 A1 | 11/2005 | Sinclair et al. |
| 2005/0273570 A1 | 12/2005 | Desouter et al. |
| 2005/0289317 A1 | 12/2005 | Liou |
| 2006/0026375 A1 | 2/2006 | Christenson |
| 2006/0050488 A1 | 3/2006 | Goodwin |
| 2006/0106984 A1 | 5/2006 | Bartley et al. |
| 2006/0139884 A1* | 6/2006 | Noble .................. 361/704 |
| 2006/0149857 A1 | 7/2006 | Holman |
| 2006/0195631 A1 | 8/2006 | Rajamani |
| 2006/0230250 A1 | 10/2006 | Klint et al. |
| 2006/0248489 A1 | 11/2006 | Ruf |
| 2007/0016704 A1 | 1/2007 | Harari et al. |
| 2007/0047655 A1 | 3/2007 | Vannerson et al. |
| 2007/0070669 A1 | 3/2007 | Tsern |
| 2007/0088995 A1 | 4/2007 | Tsern et al. |
| 2007/0195613 A1 | 8/2007 | Rajan et al. |
| 2007/0208697 A1 | 9/2007 | Subramanian et al. |
| 2007/0276977 A1 | 11/2007 | Coteus et al. |
| 2008/0001303 A1 | 1/2008 | Yu et al. |
| 2008/0024899 A1 | 1/2008 | Chu et al. |
| 2008/0028186 A1 | 1/2008 | Casselman |
| 2008/0082732 A1 | 4/2008 | Karamcheti et al. |
| 2008/0082733 A1 | 4/2008 | Karamcheti |
| 2008/0082734 A1 | 4/2008 | Karamcheti et al. |
| 2008/0082750 A1 | 4/2008 | Okin et al. |
| 2008/0082751 A1 | 4/2008 | Okin et al. |
| 2008/0082766 A1 | 4/2008 | Okin et al. |
| 2008/0094808 A1 | 4/2008 | Kanapathippillai et al. |
| 2008/0115006 A1 | 5/2008 | Smith |
| 2009/0210616 A1 | 8/2009 | Karamcheti et al. |
| 2009/0210636 A1 | 8/2009 | Karamcheti |
| 2009/0254689 A1 | 10/2009 | Karamcheti et al. |

OTHER PUBLICATIONS

Gary Million, Aug. 2000, PowerPC—MPC107 Design Guide, section 1.5, http://cache.freescale.com/files/32bit/doc/app_note/AN1849.pdf.*

Dipert, B. ; Levy, M. "Designing with Flash Memory" Annabooks. 1993. San Diego, CA. pp. 1-421.

Brown, W. ; Brewer, J. "Nonvolatile Semiconductor Memory Technology." IEEE Press, New York. 1998. pp. 189-194, 289-308.

Sharma, A. "Semiconductor Memories" IEEE Press, New York. 1997. pp. 81-139, 412-449.

Axelson, J. "USB Mass Storage" Independent Publishers Group, 2006. pp. 1-24.

Cappelletti, P. ; Golla, C. ; Olivo, P. ; Zanoni, E. "Flash Memories" Kluwer Academic Publishers. 1999. pp. 1-3, 241-257, 446-447, 481-526.

BA Chappell et al. "Main Memory Database Computer Architecture." Aug. 1991. IBM TDB. No. 3. pp. 6-12.

Galen A. Grimes. "Sams Teach Yourself Upgrading and Fixing PCs in 24 Hours". Aug. 1998. Sams Publishing, 1st Ed. pp. 53-65.

Cheung, Raymond, "AQ1207:MPC824x Architecture and Applications", "Smart Networks Developer Forum 2003 Asia", Oct. 20, 2003, Publisher: Motorola, Published in: US, 48 pages.

Connor, Deni, "Kmart shines its Blue Light on solid state disks", May 7, 2001, Publisher: itworld.com, Published in: US, 2 pages.

Lee, Hyung Gyu, "Energy Aware Memory Allocation in Heterogeneous Non-Volatile Memory Systems", Aug. 25, 2003, Publisher: ISLPED 2003, Published in: Korea, pp. 420-423.

Candea, George et al, "Microreboot A Technique for Cheap Recovery", 2004, Publisher: USENIX Association, OSDI 2004, pp. 31-44.

Unknown Author, "3.5 in SATA SSD Drive", "www.SuperTalent.com", Aug. 17, 2007, pp. 1-3, Publisher: Super Talent Technology, Published in: US, 3 pages.

Tseng, Hung-Wei et al., "An Energy Efficient Virtual Memory System with Flash Memory as the Secondary Storage", "ISLPED '06", Oct. 4, 2006, Publisher: Dept. of CS and Info Engineering, National Taiwan University, Published in: Taipei, Taiwan, pp. 418-423.

Williams, Martyn, "Solid-state disks coming on strong", "Infoworld.com", Jun. 7, 2007, Publisher: Macworld, The Mac Experts, Published in: US, 2 pages.

Young, Lee W., "PCT/US07/79619 Written Opinion and Search Report Mailed Mar. 31, 2008", 9 pages.

Young, Lee W., "PCT/US07/079622 Written Opinion and Search Report Mailed Apr. 19, 2008", 12 pages.

Young, Lee W., "PCT/US07/82162 Written Opinion and Search Report Mailed Jun. 9, 2008", 8 pages.

Thomas, Deborah A., "PCT/US07/080015 Written Opinion and Search Report Mailed Mar. 13, 2008", 9 pages.

Young, Lee W., "PCT/US09/33843 Written Opinion and Search Report Mailed Oct. 22, 2009", 14 pages.

* cited by examiner

SYSTEM AND APPARATUS WITH A MEMORY CONTROLLER CONFIGURED TO CONTROL ACCESS TO RANDOMLY ACCESSIBLE NON-VOLATILE MEMORY

CROSS REFERENCE TO RELATED APPLICATIONS

This non-provisional United States (U.S.) patent application is a divisional application and claims the benefit of U.S. patent application Ser. No. 11/847,986 entitled MAIN MEMORY IN A SYSTEM WITH A MEMORY CONTROLLER CONFIGURED TO CONTROL ACCESS TO NON-VOLATILE MEMORY, AND RELATED TECHNOLOGIES filed on Aug. 30, 2007 by inventors Vijay Karamcheti et al., to issue as U.S. Pat. No. 7,761,623. U.S. patent application Ser. No. 11/847,986 claims the benefit of U.S. Provisional Patent Application No. 60/827,421 entitled SUBSTITUTION OF A PROCESSOR WITH A BUILT IN DRAM MEMORY CONTROLLER BY A NON-DRAM MEMORY CONTROLLER TO CONTROL ACCESS TO NON-DRAM TYPE MEMORY MODULES filed on Sep. 28, 2006 by inventors Kumar Ganapathy et al, and further claims the benefit of U.S. Provisional Patent Application No. 60/862,597 entitled EXPANSION OF MAIN MEMORY IN A MULTPROCESSOR SYSTEM WITH A NON-DRAM MEMORY CONTROLLER TO CONTROL ACCESS TO NON-DRAM TYPE MEMORY filed on Oct. 23, 2006 by inventors Kumar Ganapathy et al.

FIELD

This document generally relates to memory controllers and memory modules.

BACKGROUND

A computing system may include dynamic random access memory (DRAM) integrated circuits (ICs) as part of its main memory. DRAM ICs retain data information by storing a certain amount of charge on a capacitor in each memory cell to store a logical one or alternatively, a logical zero. Over time, and because of read operations, the stored charge on the capacitor dissipates, in a process often referred to as leaking off. To preserve the stored charge on a DRAM capacitor, and thus maintain the ability of the DRAM to maintain its memory contents, the stored charge in the memory cell may be increased through refresh cycles, which sometimes are performed periodically.

BRIEF DESCRIPTIONS OF THE DRAWINGS

DETAILED DESCRIPTION

In the following detailed description, numerous examples of specific implementations are set forth. However, implementations may include configurations that include less than all of or alternatives for the detailed features and combinations set forth in these examples.

For similar memory capacity, dynamic random access memory (DRAM) integrated circuits (ICs) typically consume more power than non-volatile memory integrated circuits, particularly when data is read. Non-volatile memory integrated circuits typically do not require refresh cycles and thus conserve power. To reduce power consumption in system applications with a main memory, a non-volatile memory integrated circuit may be used in place of or as a supplement to a DRAM integrated circuit.

Typically, a write access to non-volatile memory integrated circuits takes more time than a write access to DRAM integrated circuits. Some types of non-volatile memory integrated circuits, such as NOR FLASH EEPROM integrated circuits, may be configured with improved read access times (e.g., twice that of DRAM integrated circuits). In order to address differences between read and write performance, a data communication protocol may be used that accesses the non-volatile memory modules in a different manner than DRAM memory modules.

In one configuration, a non-DRAM memory controller and non-volatile memory modules may be introduced into a computer system. The technologies used by non-volatile memory integrated circuits differ from dynamic random access memory (DRAM) integrated circuits (ICs) in the structure of their memory cell and in how they store information within the cell. These differences may help the resultant computer system achieve relatively low power consumption characteristics. For example, non-volatile memory integrated circuits typically do not require refresh cycles and thus conserve power. Alternately or in addition, they may help expand the capacity of main memory in the system.

Figure 1:
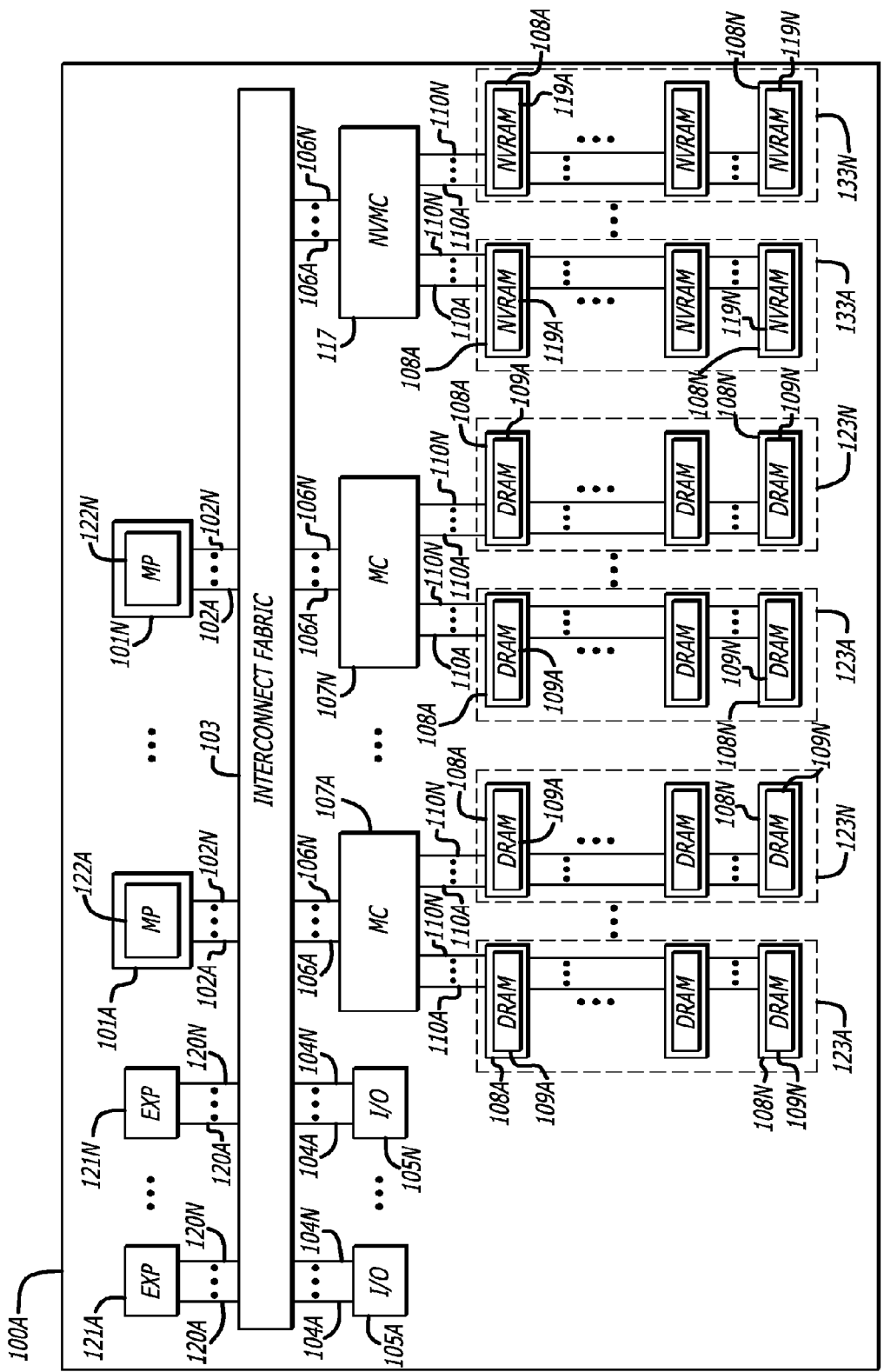
FIG. 1 is a functional block diagram of a computer system with only DRAM DIMMS wherein the memory controllers are physically separate from the processors.

Referring now to FIG. 1, a functional block diagram of a computer system is illustrated with dual in-line memory modules (DIMMS). The computer system includes a multiprocessor mother-board 100A. Mounted to the mother-board 100A is a plurality of processor sockets 101A-101N. Processors 122A-122N may be inserted into these processor sockets 101A-101N. The processor sockets are connected to the interconnect fabric 103 via traces 102A-102N. The interconnect fabric 103 may consist of printed circuit board traces alone or it may include other integrated circuits. The interconnect fabric 103 may be configured to connect the various processors, memory, and I/O together within the mother-board.

Portions of the interconnect fabric logic may be embedded within the processors and memory controllers.

Additionally mounted to the mother-board 100A are one or more memory controllers 107A-107N, 117 connected to the interconnect fabric 103 via traces 106A-106N. The memory controllers 107A-107N, 117 respectively control each of the memory channels 123A-123N, 133A-133N. Additional printed circuit board traces 110A-110N in each of the memory channels 123A-123N, 133A-133N are coupled between the memory module sockets 108A-108N and the memory controllers 107A-107N, 117.

One or more DRAM memory DIMMS 109A-109N may be accommodated by the sockets 108A-108N in the memory channels 123A-123N. One or more non-DRAM DIMMS 119A-119N, such as non-volatile random access memory (NVRAM) DIMMS, may be accommodated by the sockets 108A-108N in the memory channels 133A-133N.

Additionally mounted to the mother-board 100A are one or more I/O subsystems 105A-105N that are connected to the interconnect fabric 103 via traces 104A-104N.

Additionally mounted to the mother-board 100A may be one or more expansion (EXP) connectors 121A-121N that may be connected to the interconnect fabric by traces 120A-120N. In one configuration, one or more of the expansion connectors 121A-121N are used to upgrade the main memory of the mother-board 100A.

In FIG. 1, the memory controllers 107A-107N, 117 are directly coupled to the sockets 108A-108N in each respective memory channel 123A-123N, 133A-133N using the PCB traces 110A-110N. However, memory controllers may also indirectly couple to the sockets 108A-108N in each memory channel through secondary memory controllers.

Figure 1A:
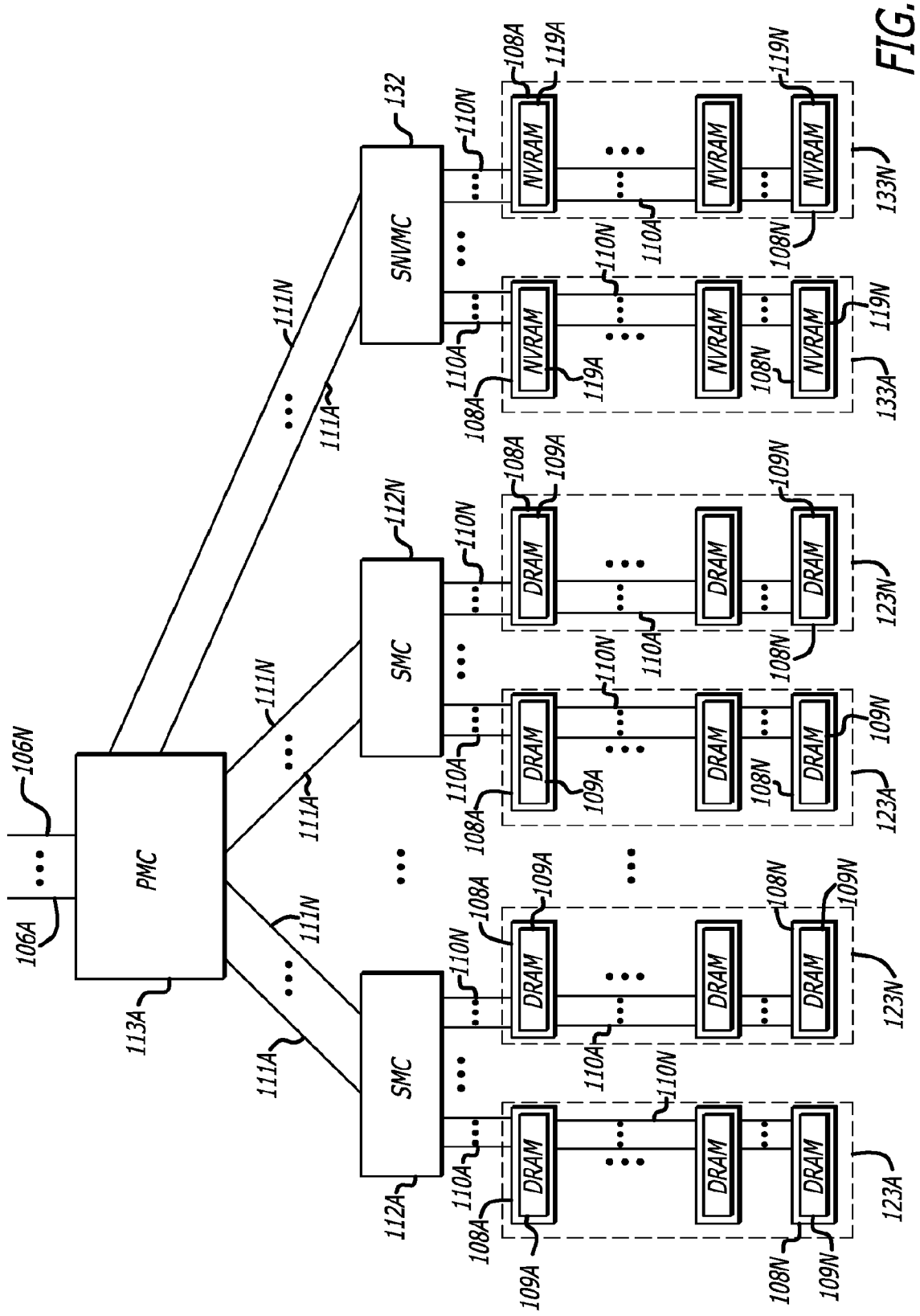
FIG. 1A is a functional block diagram of an alternate configuration of a memory controller through the use of subsidiary memory controller chips.

Referring now to FIG. 1A, an alternate memory controller system is used instead of the direct memory control provided by the memory controllers 107A-107N, 117. The alternate memory controller system includes one or more primary memory controllers (PMC) 113A for each of several or all memory control channels, and one or more secondary memory controllers (SMC) 112A-112N, (SNVMC) 132 for each of the one or more primary memory controllers 113A.

The one or more primary memory controllers (PMC) 113A connect to the interconnect fabric 103 via traces 106A-106N. In this configuration, the one or more primary memory controllers 113A are indirectly coupled to the memory channels 123A-123N, 133A-133N. Each of the one or more primary memory controllers 113A connects to the one or more secondary memory controllers (SMC) 112A-112N, (SNVMC) 132 via interconnect traces 111A-111N.

Each of the one or more secondary memory controllers 112A-112N, 132 are coupled to the DIMM sockets 108A-108N via the printed circuit board traces 110A-110N. The one or more secondary memory controllers 112A-112N may couple to one or more of the DRAM DIMMS 109A-109N inserted into the DIMM sockets 108A-108N within the memory channels 123A-123N to control the read and write access to DRAM memory modules. One or more secondary non-DRAM memory controllers (SNVMC) 132, such as a secondary non-volatile memory controller, may couple to one or more of the non-DRAM DIMMS 119A-119N (such as non-volatile memory (NVRAM) DIMMS) inserted into the DIMM sockets 108A-108N within the memory channels 133A-133N to control the read and write access to non-DRAM memory modules. In some implementations, the secondary non-DRAM memory controller 132 is a secondary non-volatile memory controller to control read and write access to non-volatile memory modules.

Figure 2A:
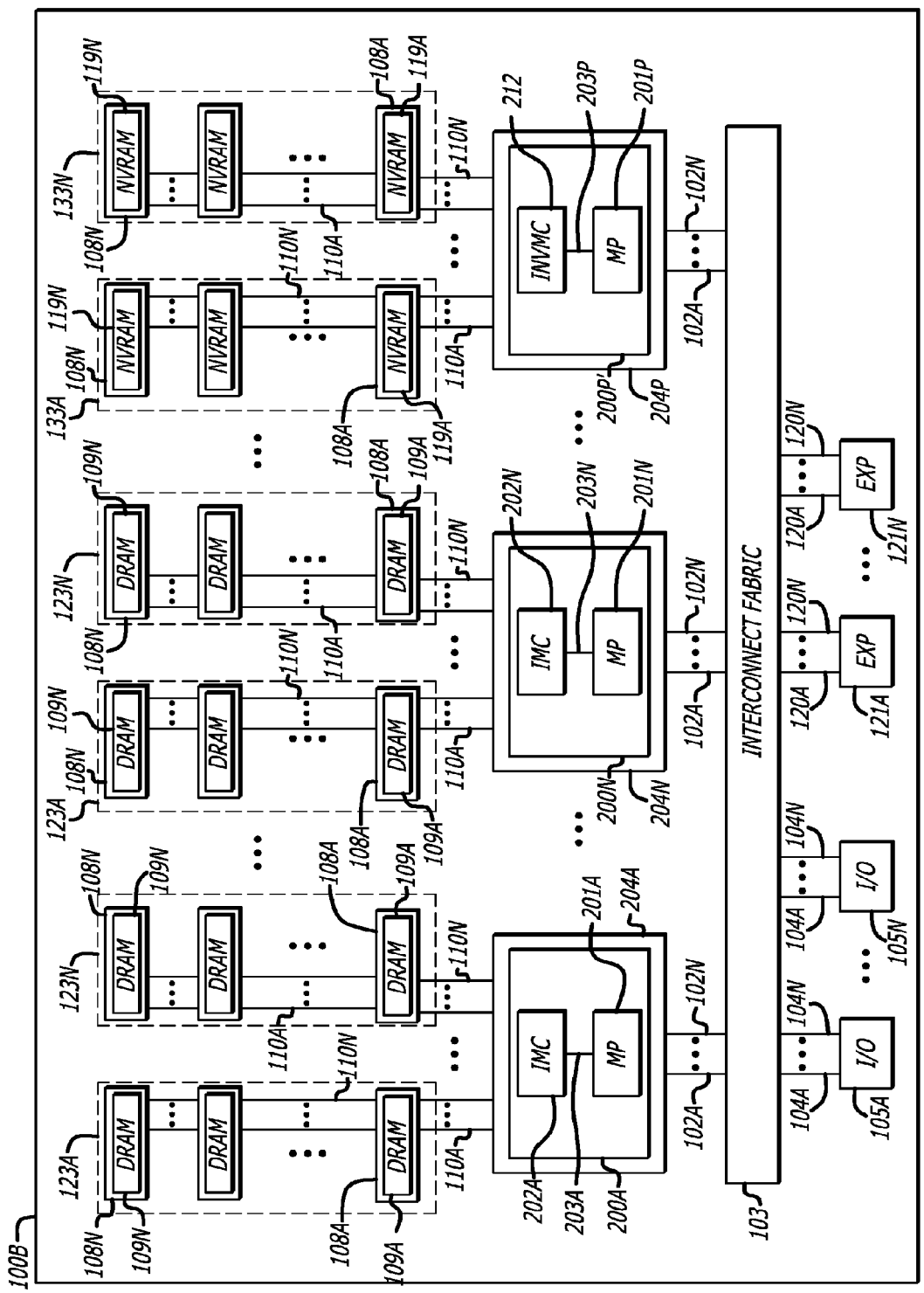
FIG. 2A is a functional block diagram of a computer system with integrated memory controllers collocated within the processors.

Referring now to FIG. 2A, an alternate multiprocessor system and mother-board 100B is illustrated. In FIG. 2A, the external memory controllers 107A-107N, 117 of FIG. 1 are moved into the processor packages 200A-200N, 200P' as part of a processor with one or more integrated memory controllers.

In the multiprocessor system 100B, processor sockets 204A-204P are connected to the interconnect fabric 103 via the traces 102A-102N. The processor sockets 204A-204N are also connected to the memory channels 123A-123N, 133A-133N via traces 110A-110N. In this construction, the processor package 200A-200N,200P' includes both one or more processor elements (MP) 201A-201P and an integrated memory controller (IMC) 202A-202N, (INVMC) 212.

The integrated memory controllers (IMC) 202A-202N control read and write accesses to DRAM memory modules 109A-109N plugged into the DIMM sockets 108A-108N within the memory channels 123A-123N. The integrated memory controller (INVMC) 212 controls read and write accesses to non-DRAM memory modules 119A-119N (such as non-volatile memory modules) plugged into the DIMM sockets 108A-108N within the memory channels 133A-133N.

There may be one or more memory controllers within a processor package.

Figure 2B:
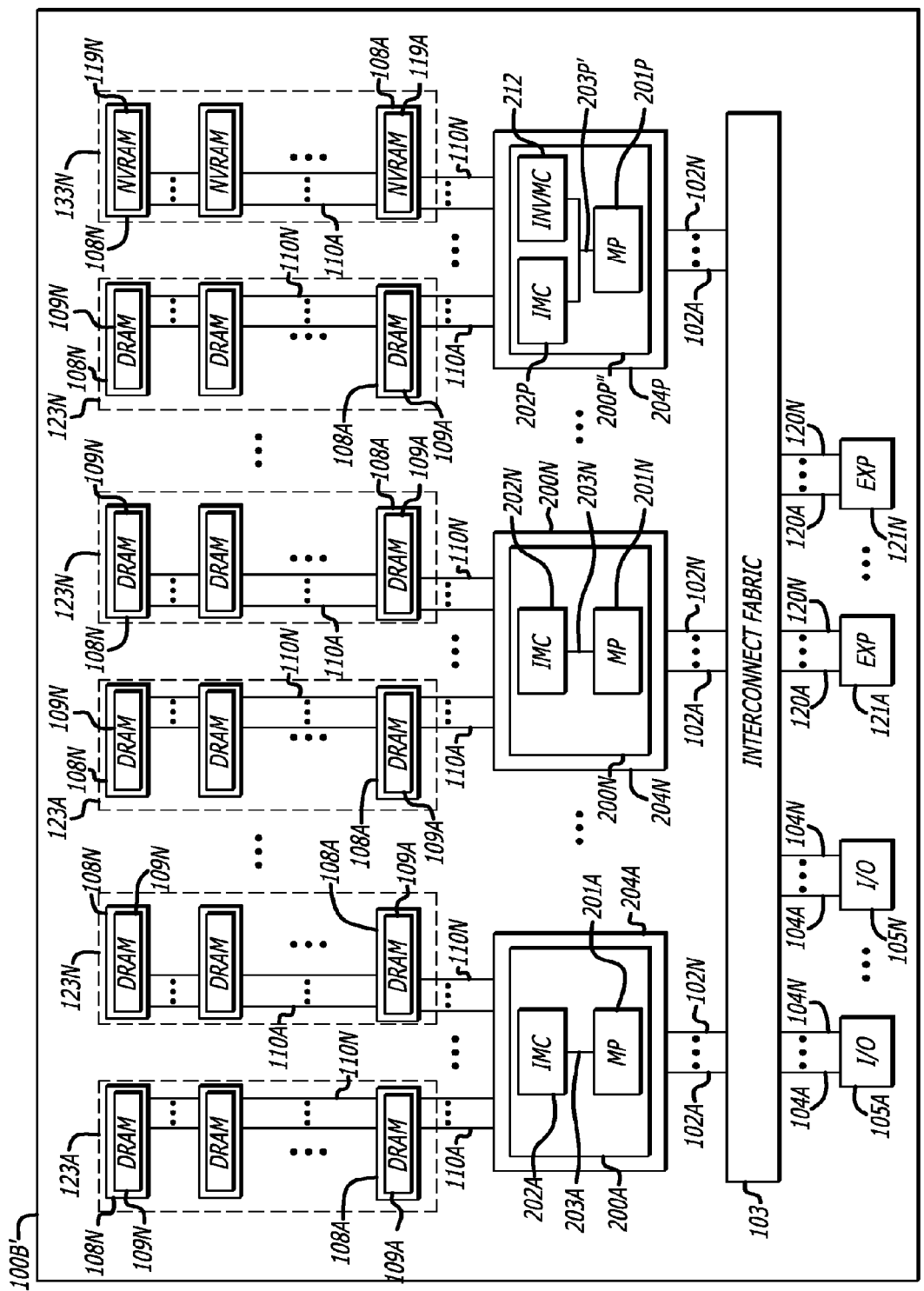
FIG. 2B is a functional block diagram of another computer system with integrated memory controllers collocated within the processors.

Referring now to FIG. 2B, another alternate multiprocessor system and mother-board 100B' is illustrated. The multiprocessor system and mother-board 100B' is similar to the multiprocessor system and mother-board 100B. However in FIG. 2B, the processor package 200P" includes one or more processor elements (MP) 201P with two integrated memory controllers 202P and 212.

The integrated memory controller (IMC) 202P controls read and write accesses to DRAM memory modules 109A-109N plugged into the DIMM sockets 108A-108N within the memory channels 123N coupled to the processor 200P". The integrated memory controller (INVMC) 212 controls read and write accesses to non-DRAM memory modules 119A-119N (such as non-volatile memory modules) plugged into the DIMM sockets 108A-108N within the memory channels 133N coupled to the processor 200P".

As previously discussed, constructions of the multiprocessor systems 100A, 100B, and 100B' may have one or more expansion connectors 121A-121N. These connectors may be used to improve system performance by increasing memory capacity with a daughter card. In some cases, they may help reduce the power consumption of the main memory of the computer system.

In one configuration, the one or more expansion connectors 121A-121N may be used to upgrade and expand the main memory of the mother-boards 100A, 100B, 100B'.

Figure 3A:
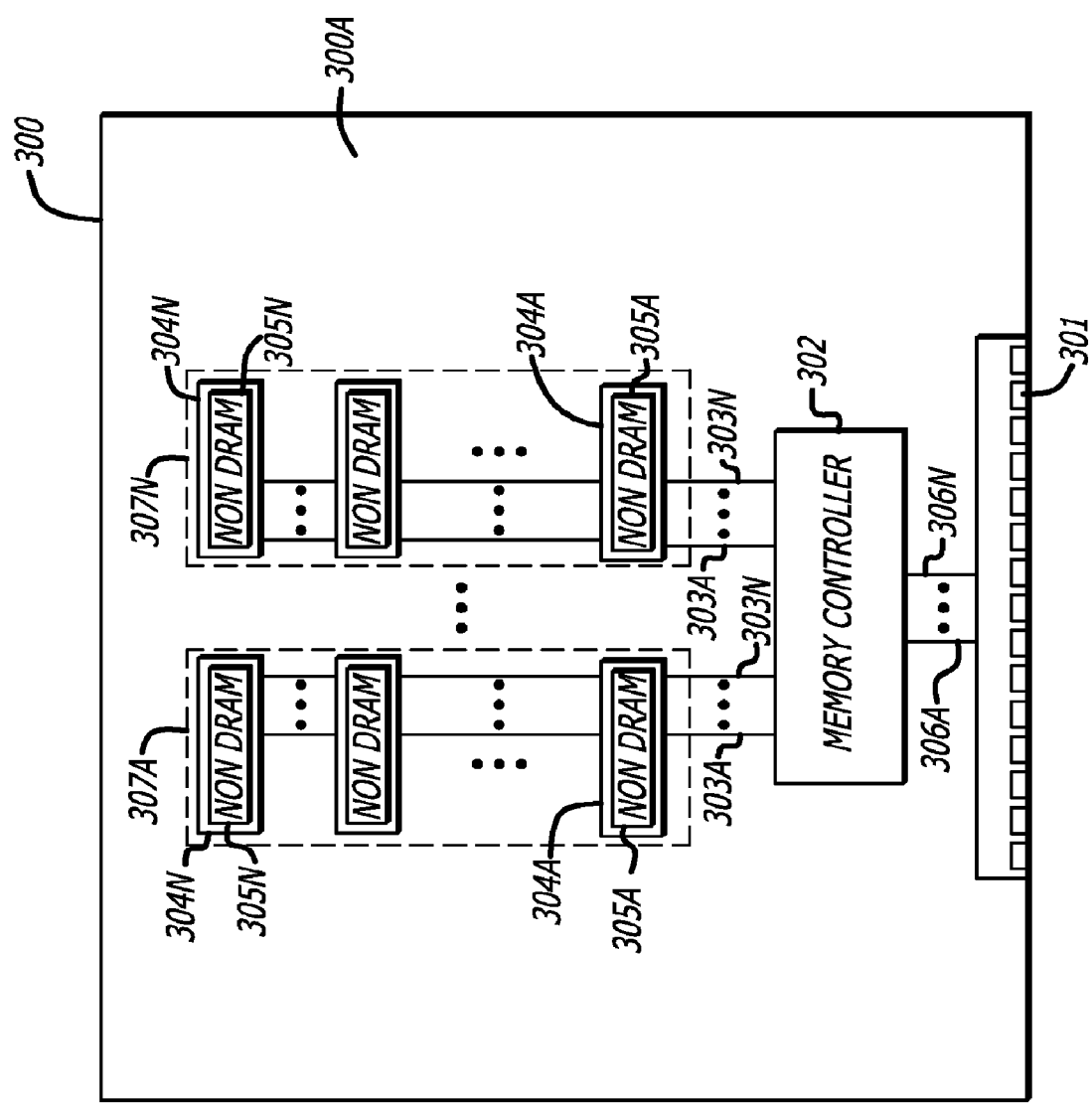
FIG. 3A is a functional block diagram of a card with a memory controller to control non-DRAM type of memory DIMMS capable of plugging into an expansion slot.

Referring now to FIG. 3A, a daughter card 300 is illustrated to upgrade the main memory in the computer systems having the mother-boards 100A, 100B, 100B'. The daughter card 300 includes a memory controller 302 to control non-DRAM type of memory DIMMS. The daughter card 300 may also be referred to herein as an expansion board.

One or more expansion boards 300 are respectively connected to the one or more expansion mother-board connectors 121A-121N in the mother-boards 100A, 100B, 100B' via the edge connector 301. The non-DRAM memory controller 302 is coupled to the edge connector 301 via traces 306A-306N on the printed circuit board 300A. The non-DRAM memory controller 302 is connected to each of the non-DRAM memory channels 307A-307N via traces 303A-303N, which, in turn, connect to sockets 304A-304N. Non-DRAM DIMMS 305A-305N are then inserted into the sockets 304A-304N to expand the main memory to include non-DRAM type of memory therein. That is, the main memory in the computer system is expanded to be a heterogeneous main memory with different types of memory integrated circuits therein.

Figure 4:
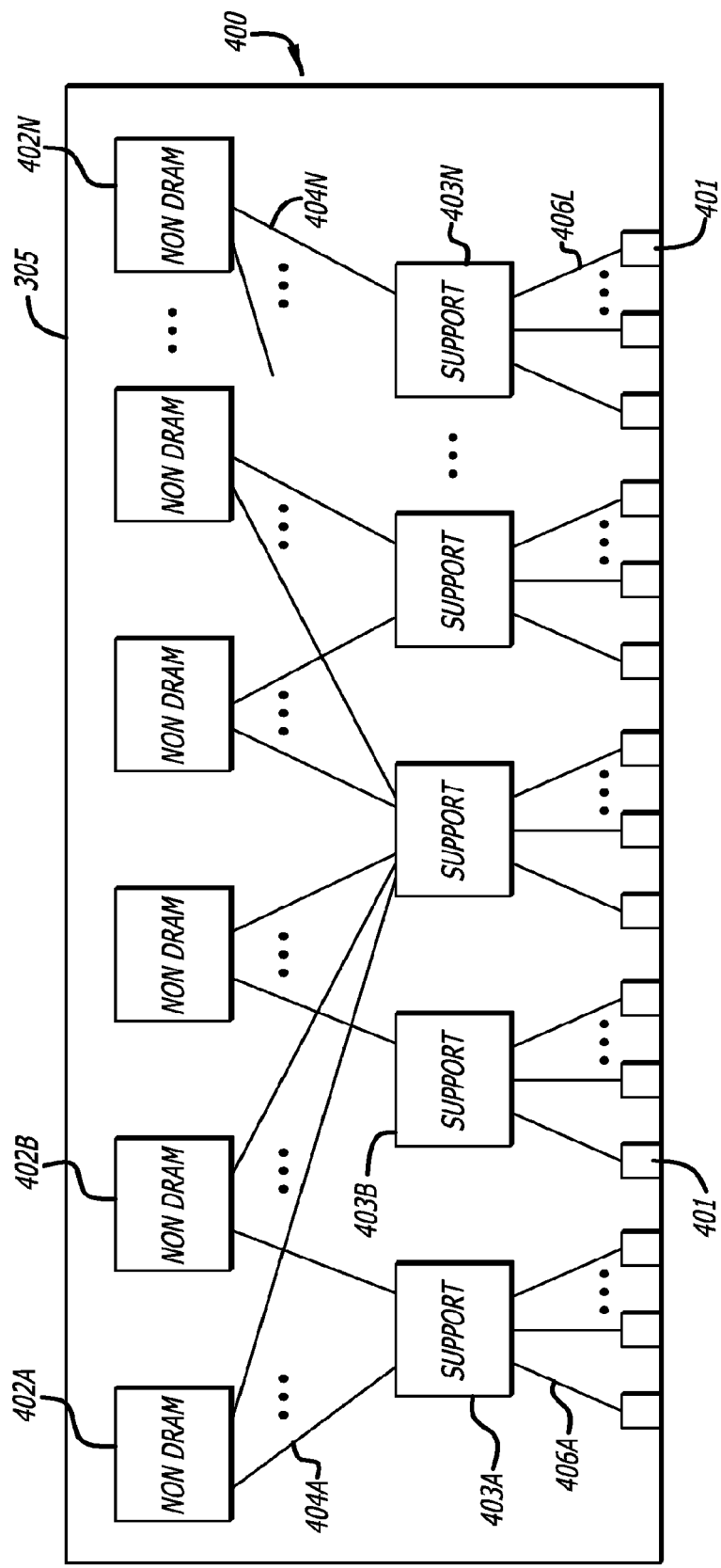
FIG. 4 is a functional block diagram of a non-DRAM type of memory module.

Referring now to FIG. 4, a diagram of a non-DRAM type of memory module 305 is illustrated. The non-DRAM type of memory module 305 may be plugged into the memory module sockets 304A-304N in the one or more non-DRAM memory channels 307A-307N of the expansion board 300A illustrated in FIG. 3A.

In one implementation, the non-DRAM type of memory module 305 is a non-volatile type of memory module. In this case, the non-DRAM memory controller 302 is a non-volatile memory controller. In particular, the non-volatile type of memory module may include at least one NOR-gate flash electrically erasable programmable read only memory (EEPROM) integrated circuit in one implementation.

In FIG. 4, the non-DRAM type of memory module 305 includes a printed circuit board 400 having pads of edge connectors 401 (one on each side for a DIMM) formed thereon, a plurality of non-DRAM memory chips 402A-402N, and a plurality of support chips 403A-403N. The memory module 305 further includes a plurality of printed circuit board traces (e.g., printed wires) 404A-404N and 406A-406L formed on the PCB 400 coupling between the non-DRAM memory chips 402A-402N and the support chips 403A-403N and between the support chips 403A-403N and the pads of the edge connectors 401.

In one implementation, the memory module 305 is a dual in-line memory module (DIMM) and the printed circuit board (PCB) 400 is a DIMM PCB. The non-DRAM memory chips 402A-402N may be NOR FLASH EEPROM integrated circuit chips or some other kind of non-DRAM type of memory integrated circuit chips.

The plurality of support chips 403A-403N may be used to buffer addresses, and/or multiplex and de-multiplex data to and from the non-DRAM memory chips 402A-403N. The plurality of support chips 403A-403N may also be referred to herein as a plurality of buffer integrated circuits 403.

In an alternate implementation, non-DRAM type of memory integrated circuits 402A-402N (e.g., NOR Flash EEPROM) and support chips 403A-403N may be directly mounted onto the printed circuit board 300A of the expansion board 300 in each memory channel 307A-307N and coupled to the traces 303A-303N without the circuit boards 400, edge connectors 401, and sockets 304A-304N.

Figure 3B:
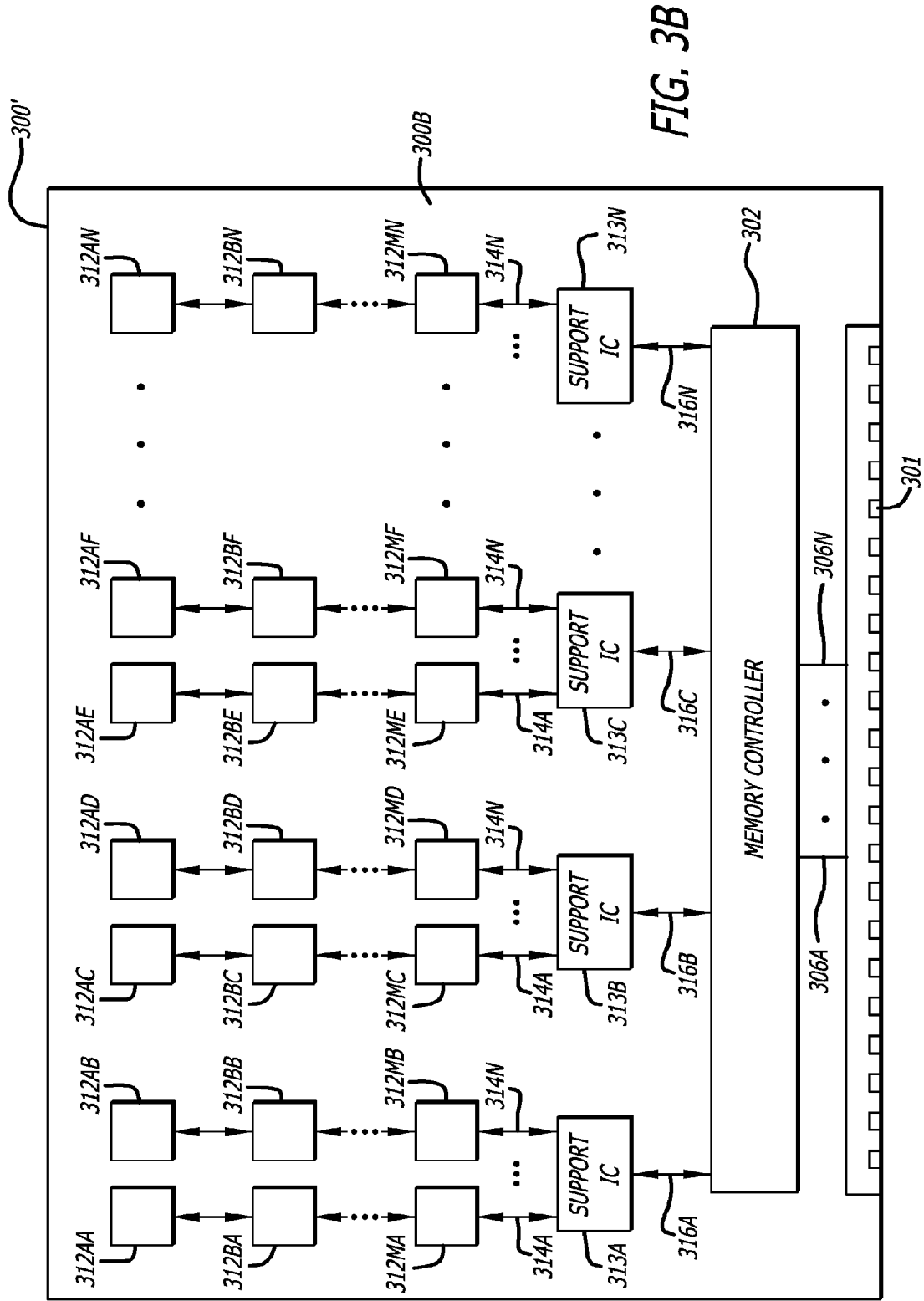
FIG. 3B is a functional block diagram of a card with a memory controller and non-DRAM type of memory mounted thereto.

Referring now to FIG. 3B, instead of non-DRAM type of memory modules being coupled to sockets of a printed circuit board, non-DRAM type of memory integrated circuits 312AA-312MN (e.g., NOR Flash EEPROM) and support chips 313A-313N are directly mounted onto the printed circuit board 300B as shown. The non-DRAM memory controller 302 is also mounted on the printed circuit board 300B. The support chips 313A-313N are coupled between the memory controller 302 and the non-DRAM type of memory integrated circuits 312AA-312MN.

In one implementation, the non-DRAM type of memory integrated circuits 312AA-312MN are non-volatile memory integrated circuits, such as NOR Flash EEPROM integrated circuits. In one configuration, read and write accesses to a non-volatile memory integrated circuit is asymmetric. In this case, a write access to non-volatile memory integrated circuits takes more time than a read access to non-volatile memory integrated circuits. Some types of non-volatile memory integrated circuits, such as NOR FLASH EEPROM integrated circuits, may be configured so that read access times may be reduced to levels sufficient for use in main memory.

If the system 300' is an expansion board, the printed circuit board 300B includes an edge connector 301 to plug into an expansion socket on a mother-board. In this case, the memory controller 302 may couple to the edge connector 301.

While an expansion board may be used to increase the capacity of main memory with non-volatile memory as discussed previously, DRAM memory modules may be swapped out for non-volatile memory modules and DRAM memory controllers may be swapped out for non-volatile memory controllers.

In accordance with the teachings of U.S. provisional patent application 60/827,421 filed on Sep. 28, 2006 by inventors Kumar Ganapathy et al., the main memory of the mother-board 100A of FIG. 1 may be upgraded to swap out DRAM memory modules with non-volatile memory modules in one or more memory channels. In doing so, relatively low power consumption characteristics may be attained by the resultant computer system. In this case (see FIG. 1), non-volatile memory modules 119A-119N are plugged into sockets 108A-108N of the respective memory channel 133A-133N.

In one implementation (see FIG. 1), one or more of the respective memory controllers of the memory channel with the non-volatile memory modules 119A-119N is a non-volatile memory controller 117 to control read and write access to the non-volatile memory modules 119A-119N. In another implementation (see FIG. 1A), one or more secondary memory controllers of the memory channel may be a non-volatile memory controller 132 to control read and write access to the non-volatile memory modules 119A-119N in the respective memory channel 133A-133N. In yet another implementation (see FIGS. 2A-2B), one or more processors in the multiprocessor system may be replaced with processor packages 200P',200P'' having one or more integrated memory controllers 212, 212 and 202P, one or more of which may be a non-volatile memory controller 212 to control read and write access to the non-volatile memory modules 119A-119N in a respective memory channel 133A-133N.

Figure 6A:
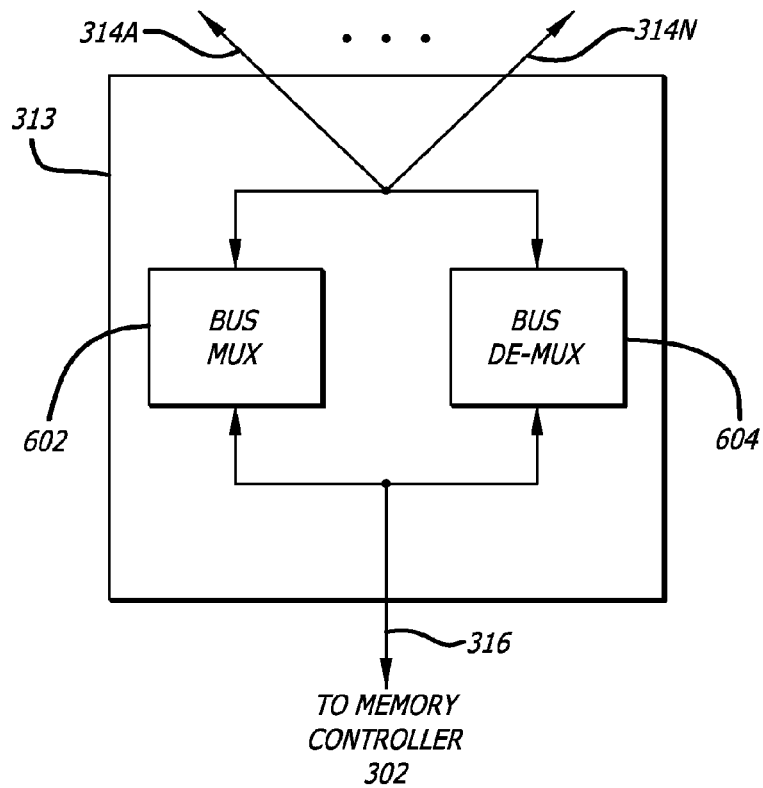
FIGS. 6A-6B are functional block diagrams of a support integrated circuit.

Referring now to FIG. 6A in accordance with one implementation, a support integrated circuit chip 313 is illustrated as an instance of each of the support chips 313A-313N illustrated in FIG. 3B or support chips 403A-403N illustrated in FIG. 4. The support integrated circuit chips support (i.e., facilitate) read and write data accesses by the non-volatile memory controllers to non-volatile type of memory modules and to non-volatile memory integrated circuits.

The support chip 313 may include a many-to-one bus multiplexer 602 and a one-to-many bus demultiplexer 604. The many-to-one bus multiplexer 602 is used to write data onto a data bus 316 such as data buses 316A-316N illustrated in FIG. 3B or printed circuit board traces 406A-406L illustrated in FIG. 4. The one-to-many bus demultiplexer 604 may be used to read data from the data bus 316, such as data buses 316A-316N or the printed circuit board traces 406A-406L, onto one of many data buses such as data buses 314A-314N or printed circuit board traces 404A-404N coupled to the memory integrated circuits.

Figure 6B:
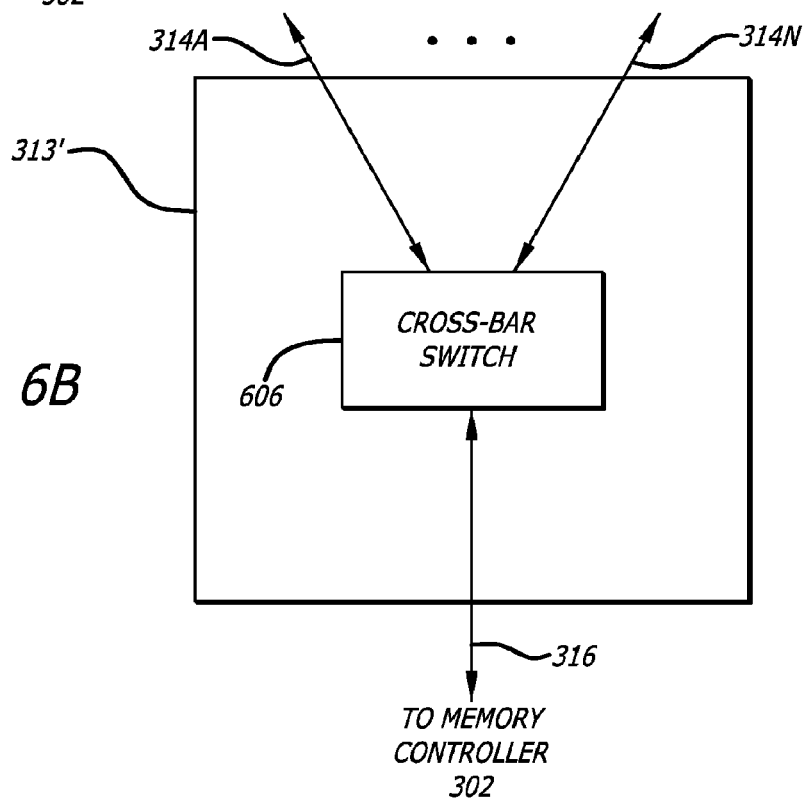

Referring now to FIG. 6B in accordance with another implementation, a support chip 313' is illustrated as an instance of each of the support chips 313A-313N illustrated in FIG. 3B or support chips 403A-403N illustrated in FIG. 4. The support chip 313' may instead include a cross-bar switch 606 coupled between the plurality of data buses 314A-314N in FIG. 3B or printed circuit board traces 404A-404N in FIG. 4 connected to the memory integrated circuits and the data bus 316 such as data buses 316A-316N illustrated in FIG. 3B or printed circuit board traces 406A-406L illustrated in FIG. 4. The cross bar switch 606 is used to write data onto the data bus 316 or printed circuit board traces 406A-406L from the memory integrated circuits. The cross bar switch 616 is used further to read data from the data bus 316 or printed circuit board traces 406A-406L and couple the data onto one of data buses 314A-314N or a plurality of printed circuit board traces 404A-404N connected to the memory integrated circuits.

Figure 7A:
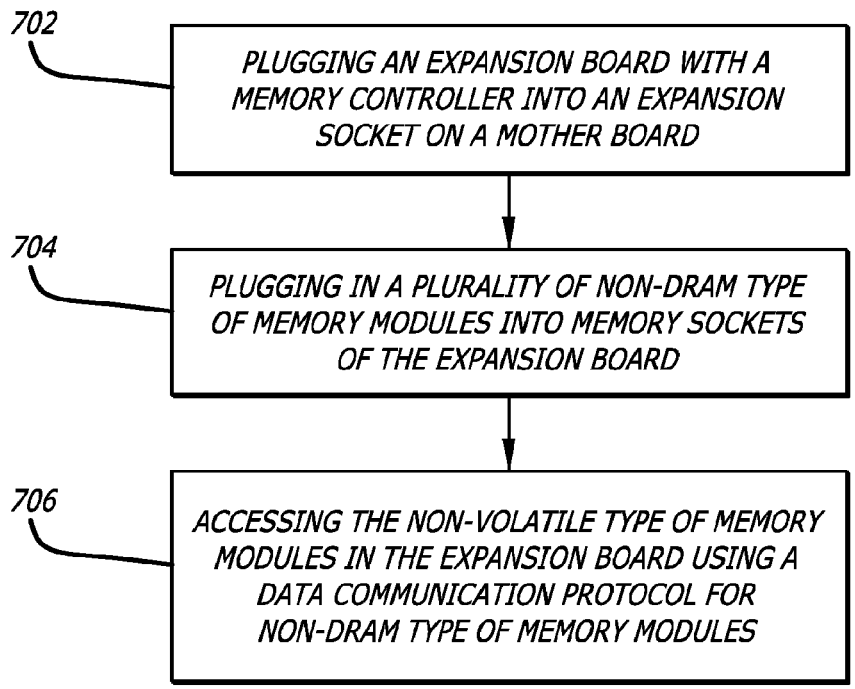
FIG. 7A illustrates a flow chart of a method for upgrading a computing system.

Referring now to FIG. 7A, a flow chart of a method for upgrading a computing system using an expansion board of the form shown in FIG. 3A or 3B is illustrated.

At block 702, an expansion board having a memory controller is plugged into an expansion socket on a mother-board. The memory controller is a non-DRAM memory controller to control read and write accesses to non-DRAM type of memory modules. In one implementation, the non-DRAM type of memory modules are non-volatile type of memory modules, such as NOR flash electrically erasable programmable read only memory (EEPROM) for example.

At block 704, a plurality of non-DRAM type of memory modules are plugged into memory sockets of the expansion board. The memory sockets are coupled to the memory controller by way of printed circuit board traces on the expansion board.

At block 706, to access the non-DRAM type of memory modules in the expansion board, a data communication protocol is used for the non-DRAM type of memory modules. The data communication protocol to access the non-DRAM type of memory modules may differ from the data communication protocol to access DRAM type of memory modules. If a non-volatile memory module is plugged into a memory module socket a data communication protocol for accessing non-volatile memory modules may be used to address the asymmetry between read and write performance.

In the data communication protocol for accessing non-volatile memory modules, a feedback status control signal is communicated from a non-volatile memory module to the memory controller to alleviate the non-deterministic nature of the erase and write operations in the non-volatile memory modules. With a feedback status control signal, the memory controller can avoid constantly polling the memory module as to when an erase or write operation is completed. Each feedback status control signal indicates whether or not a rank of memory in a memory module is busy or ready for another access to alleviate the non-deterministic nature of erase and write operations to non-volatile memory modules.

Figure 7B:
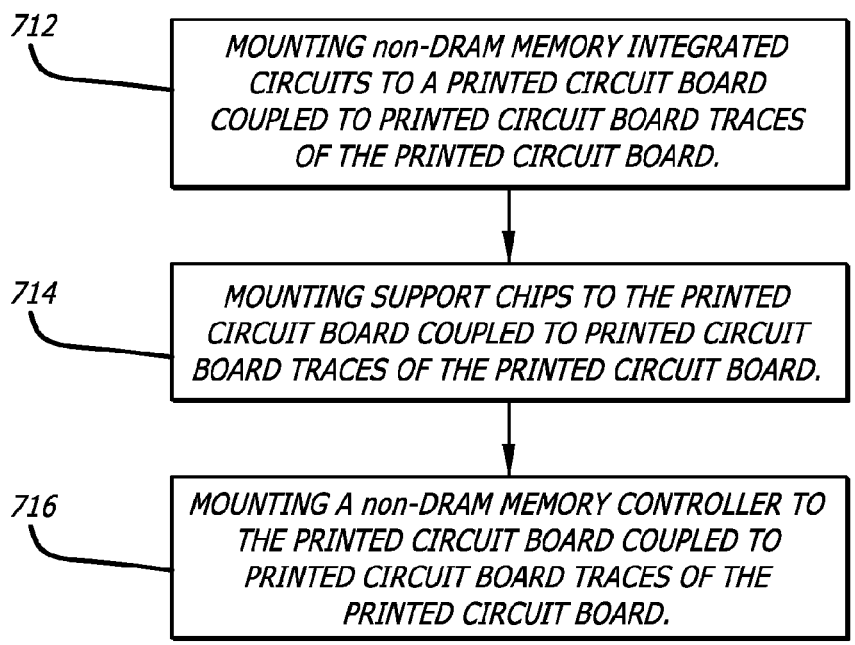
FIG. 7B illustrates a flow chart of a method for assembling a printed circuit board assembly with a memory controller and non-DRAM type of memory integrated circuits mounted thereto.

Referring now to FIG. 7B, a method of assembling a printed circuit board assembly is illustrated.

At block 712, non-DRAM type of memory integrated circuits (e.g., NOR Flash EEPROM) are mounted to a printed circuit board and coupled to the printed circuit board traces of the printed circuit board.

At block 714, support chips are also mounted onto the printed circuit board coupled to printed circuit board traces of the printed circuit board.

At block 716, a non-DRAM memory controller is also mounted on the printed circuit board and coupled to printed circuit board traces of the printed circuit board.

The support chips are coupled between the memory controller and the non-DRAM type of memory integrated circuits. In one implementation, the non-DRAM type of memory integrated circuits are non-volatile memory integrated circuits, such as NOR Flash EEPROM integrated circuits.

If the printed circuit board is manufactured as an expansion board, the method of assembly of the printed circuit board may further include coupling or forming an edge connector onto or in the printed circuit board. In this case, the non-DRAM memory controller may couple to the edge connector.

Figure 5:
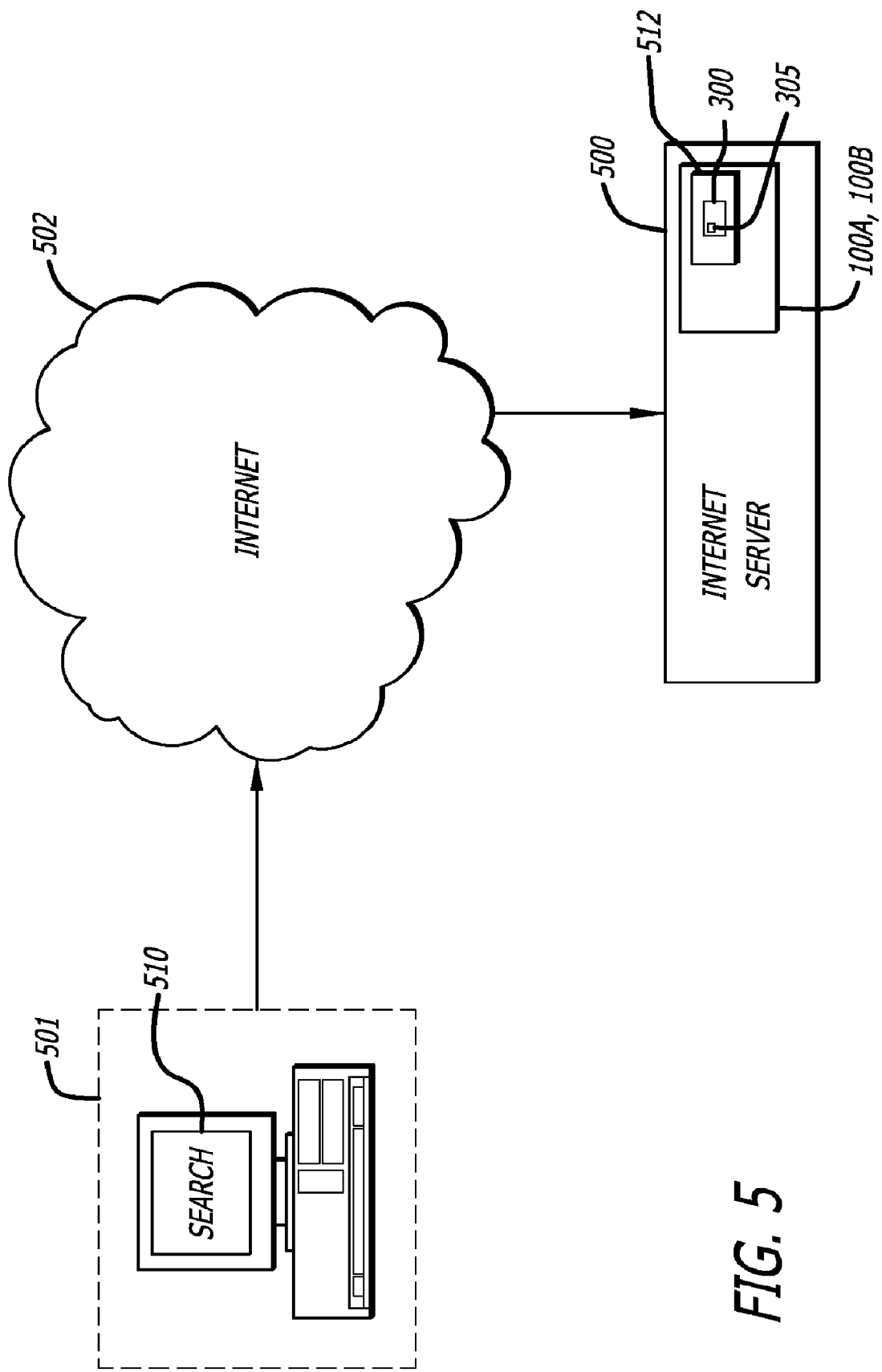
FIG. 5 is a functional block diagram of an internet server coupled to the internet.

Referring now to FIG. 5, a block diagram of an internet server 500 and a remote client 501 coupled to the internet 502 is illustrated. The internet server 500 includes the mother-board 100A, 100B, 100B' that has been upgraded by the one or more of the expansion boards 300A or 300B plugged into the one or more mother-board expansion sockets 121A-121N. Each of the expansion boards 300A include non-volatile memory modules 305 plugged into the memory module sockets of one or more added memory channels to upgrade main memory to include non-volatile memory.

An example of the use of non-volatile memory modules in main memory is now described. The remote client 501 executes a search query 510 against a search engine running on the internet server 500 to search for data. In this case, the main memory 512 on the mother-board 100A,100B associated with internet server 500 may be more often read than it is written. This application behavior permits the use of non-volatile memory modules in lieu of DRAM memory modules. With the mother-board 100A, 100B, 100B' upgraded to include non-volatile memory modules in its main memory 512, power is conserved over that of a main memory solely having DRAM memory modules. Additionally, because of the cost advantage of non-volatile memory integrated circuits over DRAM integrated circuits, the internet server 500 can be configured with the same main memory capacity for less money, or alternately, can benefit from higher main memory capacity for the same cost.

While this specification includes many specifics, these should not be construed as limitations on the scope of the disclosure or of what may be claimed, but rather as descriptions of features specific to particular implementations of the disclosure. Certain features that are described in this specification in the context of separate implementations also may be implemented in combination in a single implementation. Conversely, various features that are described in the context of a single implementation also may be implemented in multiple implementations separately or in sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

A number of implementations have been described. Nevertheless, it will be understood that various modifications may be made without departing from the spirit and scope of the disclosure. Other implementations are within the scope of the following claims. For example, the memory modules and the memory sockets have been described as being dual in-line memory modules (DIMM) and DIMM sockets. However, the memory modules and memory sockets may have other types of form factors such as single in-line memory modules (SIMM), for example.

What is claimed is:

1. A system comprising:
   a printed circuit board including
      a first memory channel having a plurality of DRAM memory modules plugged into a first plurality of sockets;
      a first memory controller coupled to the first plurality of sockets in the first memory channel by a first memory channel bus with a first plurality of traces, the first memory controller to control access to the plurality of DRAM memory modules;

a second memory channel having a first plurality of non-volatile memory modules plugged into a second plurality of sockets, the first plurality of non-volatile memory modules to conserve power; and a second memory controller coupled to the second plurality of sockets in the second memory channel by a second memory channel bus with a second plurality of traces differing from the first plurality of traces, the second memory controller to control access to the first plurality of non-volatile memory modules.

2. The system of claim 1, further comprising:

a third memory channel having a second plurality of non-volatile memory modules plugged into a third plurality of sockets, the second plurality of non-volatile memory modules differing from the first plurality of non-volatile memory modules, the second plurality of non-volatile memory modules to conserve power and expand memory capacity of main memory; and a third memory controller coupled to the third plurality of sockets in the third memory channel by a third memory channel bus with a third plurality of traces differing from the first and second pluralities of traces, the third memory controller to control access to the second plurality of non-volatile memory modules.

3. The system of claim 1, further comprising:

a processor coupled to the first memory controller and the second memory controller.

4. The system of claim 1, wherein the second memory controller is a secondary memory controller; and the system further includes a third memory controller coupled between the processor and the second memory controller.

5. The system of claim 1, wherein the first memory controller and the second memory controller are integrated with a processor into a single package coupled to the first memory channel and the second memory channel.

6. The system of claim 1, wherein a first data communication protocol supports a write access to the plurality of DRAM memory modules in the first memory channel different from a write access supported by a second data communication protocol to the first plurality of non-volatile memory modules in the second memory channel.

7. The system of claim 2, wherein a first data communication protocol supports a write access to the plurality of DRAM memory modules in the first memory channel different from a write access supported by a second data communication protocol to the first plurality of non-volatile memory modules in the second memory channel, and a third data communication protocol to access the second plurality of non-volatile memory modules in the third memory channel differs from the second data communication protocol to access the first plurality of non-volatile memory modules in the second memory channel.

\* \* \* \* \*